(12) United States Patent
Braje et al.

(10) Patent No.: US 12,032,044 B2
(45) Date of Patent: Jul. 9, 2024

(54) OSCILLATOR-BASED SOLID-STATE SPIN SENSOR

(71) Applicant: Massachusetts Institute of Technology, Cambridge, MA (US)

(72) Inventors: Danielle A. Braje, Winchester, MA (US); Jennifer Schloss, Cambridge, MA (US); Linh M. Pham, Arlington, MA (US); John F. Barry, Arlington, MA (US); Erik R. Eisenach, Cambridge, MA (US); Michael F. O'Keeffe, Medford, MA (US); Jonah A. Majumder, Cambridge, MA (US); Jessica Kedziora, Shirley, MA (US); Peter Moulton, Concord, MA (US); Matthew Steinecker, Medford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 676 days.

(21) Appl. No.: 17/134,589

(22) Filed: Dec. 28, 2020

(65) Prior Publication Data
US 2021/0263117 A1 Aug. 26, 2021

Related U.S. Application Data

(60) Provisional application No. 62/981,982, filed on Feb. 26, 2020.

(51) Int. Cl.
*G01R 33/24* (2006.01)
*H01P 1/18* (2006.01)
(Continued)

(52) U.S. Cl.
CPC ............... *G01R 33/24* (2013.01); *H01P 1/18* (2013.01); *H01P 3/06* (2013.01); *H01P 5/18* (2013.01); *H01P 7/10* (2013.01); *H03B 5/1864* (2013.01)

(58) Field of Classification Search
CPC ... G01R 33/24; H01P 1/18; H01P 3/06; H01P 5/18; H01P 7/10
See application file for complete search history.

(56) References Cited

U.S. PATENT DOCUMENTS 3,471,811 A 10/1969 Klotz
4,110,686 A 8/1978 Leskovar et al.
(Continued)

FOREIGN PATENT DOCUMENTS

CN 107271456 A 10/2017
CN 107271456 B * 8/2019 ............ G01N 22/00
(Continued)

OTHER PUBLICATIONS

International Search Report and Written Opinion in International Patent Application No. PCT/US2021/019727 mailed Jan. 12, 2022 (10 pages).
(Continued)

*Primary Examiner* — Gregory H Curran
(74) *Attorney, Agent, or Firm* — Smith Baluch LLP

(57) ABSTRACT

We have developed a high-performance, low-volume, low-weight, and low-power sensor based on a self-sustaining oscillator. The techniques described here may be used for sensing various fields; we demonstrate magnetic sensing. The oscillator is based on a dielectric resonator that contains paramagnetic defects and is connected to a sustaining amplifier in a feedback loop. The resonance frequency of the dielectric resonator shifts in response to changes in the magnetic field, resulting in a shift in the frequency of the
(Continued)

self-sustaining oscillator. The value of the magnetic field is thereby encoded in the shift or modulation output of the self-sustaining oscillator. The sensor as demonstrated uses no optics, no input microwaves, and, not including digitization electronics, consumes less than 300 mW of power and exhibits a sensitivity at or below tens of $pT/\sqrt{Hz}$. In some implementations, the sensor is less than 1 mL in volume.

20 Claims, 11 Drawing Sheets

(51) Int. Cl.
*H01P 3/06* (2006.01)
*H01P 5/18* (2006.01)
*H01P 7/10* (2006.01)
*H03B 5/18* (2006.01)

(56) References Cited

U.S. PATENT DOCUMENTS

| | | | |
|---|---|---|---|
| 10,705,163 B2 | 7/2020 | Barry et al. | |
| 10,712,408 B2 | 7/2020 | Pham et al. | |
| 10,962,611 B2 | 3/2021 | Barry et al. | |
| 2017/0010338 A1* | 1/2017 | Bayat | G01R 33/323 |
| 2017/0077665 A1* | 3/2017 | Liu | H01S 1/005 |
| 2018/0136291 A1* | 5/2018 | Pham | G01R 33/24 |
| 2019/0178958 A1 | 6/2019 | Barry et al. | |
| 2020/0025835 A1 | 1/2020 | Pham et al. | |
| 2020/0064419 A1 | 2/2020 | Barry et al. | |
| 2021/0011098 A1 | 1/2021 | Pham et al. | |
| 2022/0011383 A1 | 1/2022 | Barry et al. | |

FOREIGN PATENT DOCUMENTS

| | | |
|---|---|---|
| CN | 107271456 B | 8/2019 |
| WO | 2019108781 A1 | 6/2019 |

OTHER PUBLICATIONS

Black, "An introduction to Pound-Drever-Hall laser frequency stabilization." American Journal of Physics 69.1 (2001): 79-87.
Fluhr et al., "Characterization of the individual short-term frequency stability of cryogenic sapphire oscillators at the $10^\wedge$-16 level." IEEE Transactions on Ultrasonics, Ferroelectrics, and Frequency Control 63.6 (2016): 915-921.
Giordano et al., "Tests of sapphire crystals manufactured with different growth processes for ultra-stable microwave oscillators." IEEE Transactions on Microwave Theory and Techniques 64.1 (2015): 78-85.
Giordano et al., "The autonomous cryocooled sapphire oscillator: a reference for frequency stability and phase noise measurements." Journal of Physics: Conference Series. vol. 723. No. 1. IOP Publishing, 2016. 8 pages.
Hartnett et al., "Microwave secondary frequency standards: Stability limits due to intrinsic fluctuations in frequency discriminator." IEEE Microwave and Guided Wave Letters 10.8 (2000): 328-330.
Ivanov et al., "Applications of interferometric signal processing to phase-noise reduction in microwave oscillators." IEEE Transactions on Microwave Theory and Techniques 46.10 (1998): 1537-1545.
Ivanov et al., "Low phase-noise sapphire crystal microwave oscillators: current status." IEEE Transactions on Ultrasonics, Ferroelectrics, and Frequency Control 56.2 (2009): 263-269.
Ivanov et al., "Ultra-low-noise microwave oscillator with advanced phase noise suppression system." IEEE Microwave and Guided Wave Letters 6.9 (1996): 312-314.
Locke et al., "Invited article: Design techniques and noise properties of ultrastable cryogenically cooled sapphire-dielectric resonator oscillators." Review of Scientific Instruments 79.5 (2008): 051301. 13 pages.
Luiten et al., "Ultra-stable sapphire resonator-oscillator." IEEE Transactions on Instrumentation and Measurement 42.2 (1993): 439-443.
McNeilage et al., "Review of feedback and feedforward noise reduction techniques." Proceedings of the 1998 IEEE International Frequency Control Symposium (Cat. No. 98CH36165). IEEE, 1998. 10 pages.
Nand et al., "Resonator power to frequency conversion in a cryogenic sapphire oscillator." Applied Physics Letters 103.4 (2013): 043502. 5 pages.
Pound, "Electronic frequency stabilization of microwave oscillators." Review of Scientific Instruments 17.11 (1946): 490-505.
Rubiola et al., "Advanced interferometric phase and amplitude noise measurements." Review of Scientific Instruments 73.6 (2002): 2445-2457.
Rubiola et al., "On the flicker noise of ferrite circulators for ultra-stable oscillators." IEEE Transactions on Ultrasonics, Ferroelectrics, and Frequency Control 51.8 (2004): 957-963.
Santiago et al., "Microwave frequency discriminator with a cooled sapphire resonator for ultra-low phase noise." Proceedings of the 1992 IEEE Frequency Control Symposium. IEEE, 1992. 7 pages.
U.S. Appl. No. 17/317,983, filed May 12, 2021.
Walls et al., "High spectral purity X-band source." 44th Annual Symposium on Frequency Control. IEEE, 1990. 7 pages.
Carvalho et al. "Piezoelectric tunable microwave superconducting cavity." Review of Scientific Instruments 87.9 (2016): 09470, 4 pages.
Eisenach et al. "Cavity quantum electrodynamic readout of a solid-state spin sensor." arXiv preprint arXiv:2003.01104 (2020) (8 pages).
Eisenach et al. "Cavity-enhanced microwave readout of a solid-state spin sensor." Nature Communications 12.1 (2021): 1-7.
Koda et al., "Highly Sensitive Magnetic Field Sensing Using Magnetization Dynamics in Yttrium Iron Garnet Single-Crystal Thin Films." IEEE Transactions on Magnetics 55.7 (2019): 1-4.
Putz et al. "Protecting a spin ensemble against decoherence in the strong-coupling regime of cavity QED." Nature Physics 10.10 (2014): 720-724.
Xia et al. "Detection of a weak magnetic field via cavity-enhanced faraday rotation." Physical Review A 92.4 (2015): 043409, 8 pages.

\* cited by examiner

OSCILLATOR-BASED SOLID-STATE SPIN SENSOR

CROSS-REFERENCE TO RELATED APPLICATIONS

This application claims the priority benefit, under 35 U.S.C. 119(e), of U.S. Application No. 62/981,982, which was filed on Feb. 26, 2020, and is incorporated herein by reference in its entirety.

GOVERNMENT SUPPORT

This invention was made with government support under FA8702-15-D-0001 awarded by the U.S. Air Force. The government has certain rights in the invention.

BACKGROUND

Solid-state spin sensors employ spin center defects, including color center defects, in a solid-state host to measure one or more physical parameters or quantities, such as magnetic field, electric field, temperature, pressure, or the presence of an atomic, molecular, or other hadronic species. The spin center defects are point-like defects inside a solid-state host, such as nitrogen vacancies (NVs) in diamond, that sense the physical quantity. Their quantum spin states can be manipulated by optical excitation and microwave radiation, making the quantum spin states sensitive to the physical parameter(s).

A conventional solid-state spin sensor operates as follows. An optical radiation source illuminates one or more spin center defects within the solid-state spin sensor with optical excitation radiation. The optical excitation radiation causes the spin center defects to emit fluorescent light, which is collected by a light sensor. The spin center defects may also be irradiated with microwave radiation. In some implementations, the microwave radiation is used to manipulate the population distribution between the quantum energy levels (quantum spin states) of the spin center defects.

The optical excitation radiation and microwave radiation may be applied simultaneously, sequentially, or both simultaneously and sequentially. The application of the optical and microwave radiation to the solid-state spin sensor is arranged so that information pertaining to the physical quantity to be measured is encoded in fluorescent light emitted by the spin center defects. For example, if a diamond containing nitrogen-vacancy spin center defects is illuminated with green light (light at a wavelength of 495-570 nm) and appropriate microwave radiation, the diamond may emit red fluorescent light (light at a wavelength of 630-850 nm) that encodes the distribution of the nitrogen vacancy population among the quantum spin states. This population distribution depends in turn on the physical parameter applied to the nitrogen vacancies. Thus, the detected fluorescence represents the physical quantity experienced by the nitrogen vacancies. When the physical parameter is a magnetic field, this fluorescence-based measurement is called an optically detected magnetic resonance (ODMR) measurement.

SUMMARY

Although ODMR measurements can be extremely sensitive, they involve lasers, external microwave sources, and photodetectors in addition to the solid-state crystal host with spin center defects. The sensors disclosed here have can make measurements with a solid-state host containing paramagnetic defects that are at least as sensitive as ODMR measurements but without the lasers, external microwave sources, or photodetectors used for ODMR measurements. Instead, the solid-state host is connected to a sustaining amplifier in a feedback loop to form a self-sustaining oscillator whose oscillation frequency depends on the physical parameter(s) measured by the sensor. Possible physical parameters include the magnetic field, electric field, temperature, strain, and/or pressure (stress) experienced by the paramagnetic defects.

In operation, the sensor encodes the value of the physical parameter to be measured, such as magnetic field amplitude, in the output frequency of the self-sustaining oscillator. The sensor uses transmission of microwave probe radiation through a dielectric resonator, at least part of which is magnetically sensitive, as an element of the self-sustaining oscillator. The dielectric resonator can be composed of a single crystal that contains paramagnetic defects whose energy levels change in response to an applied magnetic field or other physical parameter to be measured. The resonance frequency of the dielectric resonance can be tuned near the zero field splitting of the paramagnetic defects, e.g., with a bias magnetic field or by changing the size of the dielectric resonator.

Alternatively, the dielectric resonator can be composed of two components, one of which contains no paramagnetic defects and the other of which is a single crystal containing paramagnetic defects whose energy levels change in response to applied magnetic fields, electric fields, pressure, stress, strain, temperature, or another physical parameter to be measured. The component without defects forms the resonant structure and should be smaller and have a higher quality factor for better performance. It can be made of sapphire, strontium titanate, a sintered microwave ceramic, or another suitable material.

An inventive magnetometer can be implemented with a solid-state host, a sustaining amplifier, and a digitizer. The solid-state host comprises paramagnetic defects having spin resonances that shift in response to a magnetic field and have linewidths of between 1 kHz and 50 MHz. The sustaining amplifier is connected in a positive feedback loop with the solid-state host. In operation, it amplifies a microwave signal modulated by a shift in the dielectric resonances of the paramagnetic defects caused by the magnetic field. The digitizer is operably coupled to the sustaining amplifier and/or the solid-state host and digitizes a portion of the microwave signal.

The solid-state host may resonate at a center frequency of the microwave signal in an absence of the magnetic field. It may form part or all of a dielectric resonator having a quality factor of about 1000 to about 100,000. The solid-state host can resonate at a frequency in the frequency band of about 1 GHz to about 25 GHz The magnetometer may also include a cavity shield, surrounding the solid-state host, to shield the solid-state host from radiative loss. This cavity shield may include a metallic component having a thickness greater than or equal to one skin depth at the center frequency of the microwave signal.

The magnetometer may also include an input coupler and an output coupler. The input coupler is operably connected to an output of the sustaining amplifier and couples the microwave signal from the output of the sustaining amplifier to the solid-state host. And the output coupler is operably connected to an input of the sustaining amplifier and couples the microwave signal from the solid-state host to the input of the sustaining amplifier.

The magnetometer may also include: a directional coupler, operably coupled to the digitizer and to at least one of the solid-state host or the sustaining amplifier, to couple the portion of the microwave signal to the digitizer; a phase shifter, in the feedback loop, to adjust a path length of the feedback loop; a bandpass filter, in electromagnetic communication with an input of the sustaining amplifier, to filter at least one spurious signal from the microwave signal; and/or a bias magnet, in electromagnetic communication with the paramagnetic defects, to apply a bias magnetic field to the paramagnetic defects, the bias magnetic field splitting the dielectric resonances.

Another inventive magnetometer comprises an oscillator, a sensor, and a processor. The oscillator comprises a dielectric resonator connected in a feedback loop with an amplifier and is configured to oscillate at a microwave oscillation frequency. The dielectric resonator includes paramagnetic defects having dielectric resonances that shift the microwave oscillation frequency in response to a magnetic field. The sensor is operably coupled to the oscillator and measures the microwave oscillation frequency. And the processor is operably coupled to the sensor and determines an amplitude of the magnetic field based on the microwave oscillation frequency.

Another inventor sensor includes a self-sustaining oscillator with paramagnetic defects in a crystal host. The paramagnetic defects have energy levels that change in response to changes in a physical parameter. The sensor encodes a value of the physical parameter in an output frequency of the self-sustaining oscillator.

The sensor may include a dielectric resonator, as least part of which is magnetically sensitive, that is configured to transmit microwave probe radiation with a transmission that varies in response to a change in the physical parameter. This dielectric resonator can be formed entirely of the crystal host or it can include the crystal host and a component without paramagnetic defects, such as a microstrip transmission line resonator, a loop gap resonator, or a cavity resonator. The dielectric resonator has a resonance frequency tuned near a zero field splitting of the paramagnetic defects.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Spin-resonator coupling works as follows: for a given defect and the crystal, there is a transition frequency between different quantum energy levels of the defect. In NV⁻ in diamond, these transitions are centered near 2.87 GHz; in ruby (trivalent chromium in sapphire), this frequency is 11.5 GHz. This frequency is called the zero field splitting (ZFS) and varies slightly with temperature but otherwise remains relatively constant. The spins capture information about applied magnetic fields that can be transferred to and read from a dielectric resonator (cavity). Reading out the cavity tends to be easier and lead to a higher fidelity measurement than reading out the spins using optical techniques. The activity of the spins can be inferred from the center frequency of the dielectric resonator.

In more detail, the magnetic field changes the resonance frequencies of the spins. Changing the spin resonance frequencies moves the dielectric resonator frequency. By determining the center frequency of the cavity, e.g., either by direct interrogation with microwaves or by creating a self-sustaining oscillator, it is possible to infer the magnetic field amplitude from the behavior of the cavity and the spins. The transfer of information between the spins and the dielectric resonator occurs with peak efficiency when the resonance frequency of the spins and of the dielectric resonator are the same and have narrow linewidths (e.g., between 1 kHz and 50 MHz). The spins' resonant frequency is fixed by the spin transitions, but the resonator's shape, size, etc. can be selected so that the resonator's resonant frequency is very close if not equal to the spins' resonant frequency.

Figure 1A:
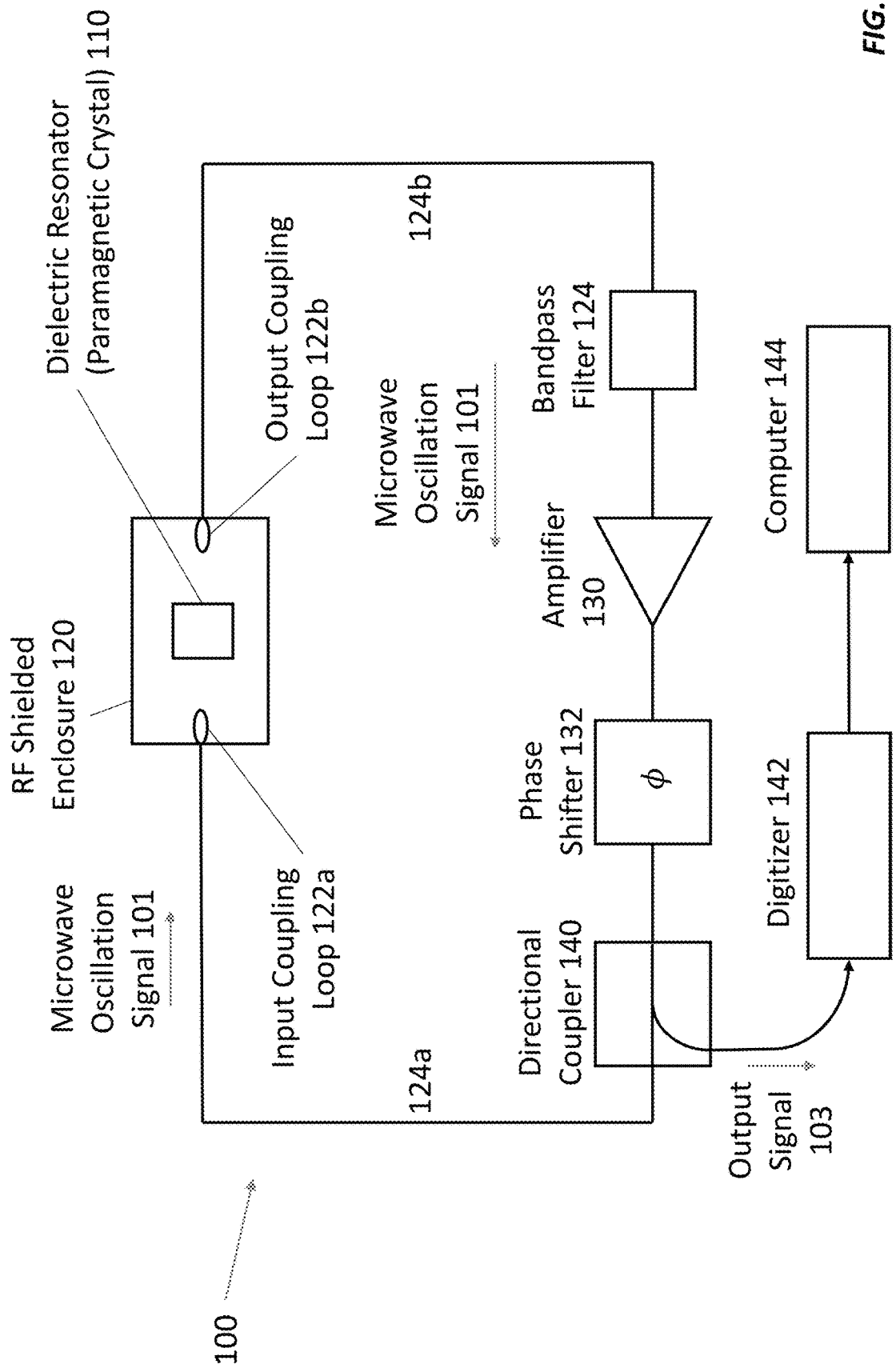
FIG. 1A shows an oscillator sensor with a dielectric resonator in an RF-shielded enclosure in a feedback loop with a bandpass filter, sustaining amplifier, phase shifter, and directional coupler, which provides an output signal representing the external (e.g., magnetic) field to a digitizer and computer (processor).
Figure 1B:
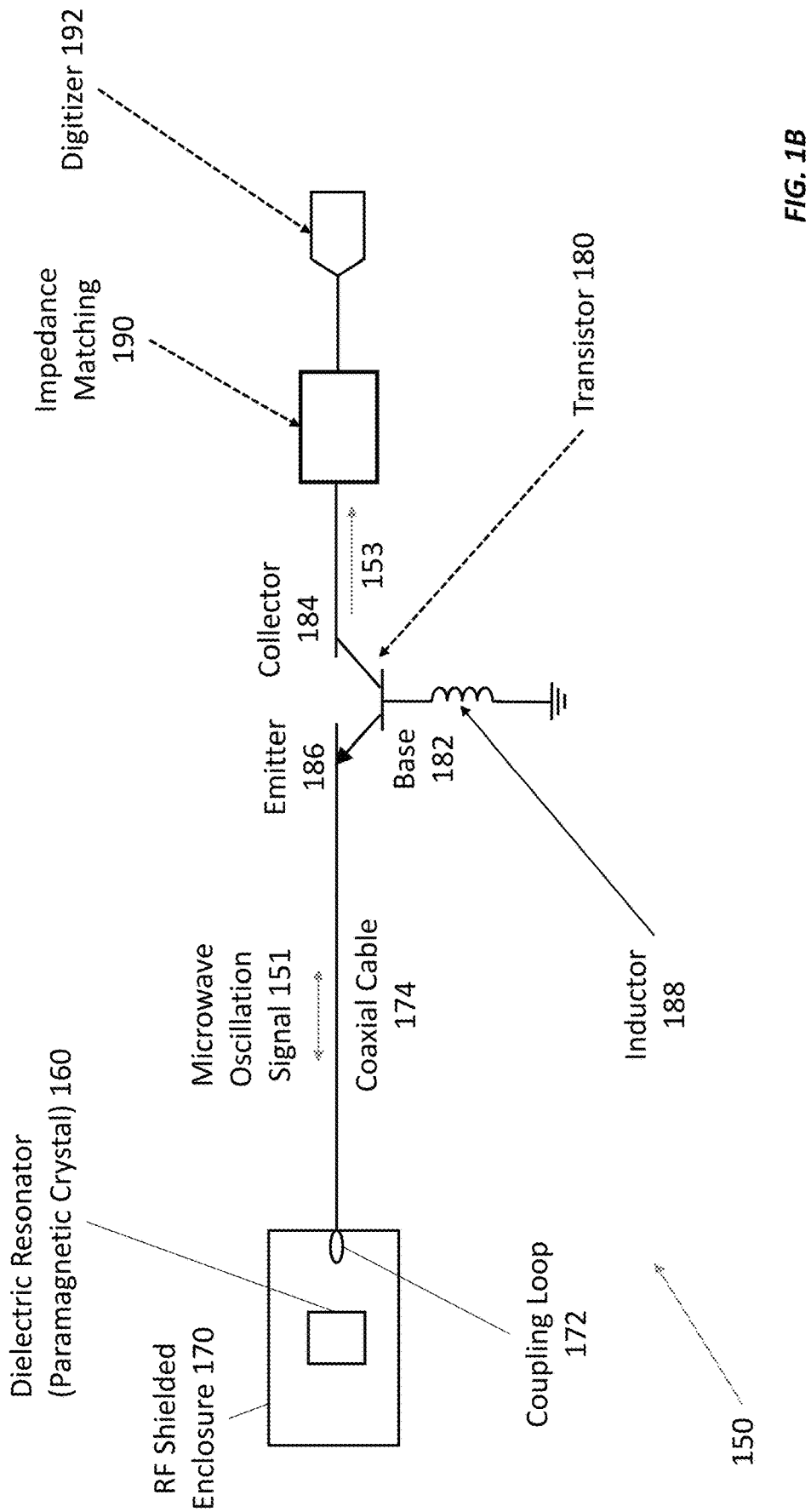
FIG. 1B shows an oscillator sensor with a dielectric resonator in a one-port (reflection-type) oscillator geometry.

FIG. 1A shows a self-sustaining oscillator 100 that can be used to sense a physical parameter, such as a magnetic field, electric field, pressure (stress) change, strain change, or temperature change. The oscillator 100 includes a dielectric resonator 110 that is coupled in a feedback loop with a sustaining microwave amplifier 130. A sinusoidal microwave oscillation signal 101 (also called a microwave signal) propagates clockwise around this feedback loop, which also includes a bandpass filter 124, phase shifter 132, and directional coupler 140 coupled in series in the loop. The directional coupler 140 has an extra output port that is coupled to a digitizer (analog-to-digital converter) 142, which is coupled in turn to a computer 144 or other processor. In this example, the oscillator 100 is implemented using a ring topology; the oscillator 100 can just as easily be implemented using a one-port topology as shown in FIG. 1B and described below.

The dielectric resonator 110 is a solid-state host crystal which contains paramagnetic defects (not shown) that exhibit one or more dielectric resonances in the MHz or GHz frequency range. The paramagnetic defects are point-like defects inside the solid state host crystal. As explained in greater detail below, they exhibit discrete energy levels which change in response to the physical parameter to be measured. Changes in these energy levels caused by changes in the physical parameter shift the phase and frequency of the microwave oscillation signal 101. As a result, the instantaneous frequency of the microwave oscillation signal 101 depends on the value of the physical parameter being measured (e.g., the amplitude of an external magnetic or electric field).

The dielectric resonator 110 is housed or mounted inside an RF-shielded enclosure or cavity shield 120. The cavity shield 120 prevents radiative and other loss mechanisms from reducing the quality factor of the dielectric resonator 110. The cavity shield 120 can be partially or completely composed of silver, copper, aluminum, or another metal with a thickness is greater than its skin depth at the frequencies in the band over which the oscillator 100 oscillates (i.e., the frequency of the microwave signal 101). An input coupling loop 122a inside the cavity shield 120 couples the microwave signal 101 from one end 124a of a coaxial cable or other transmission line to the dielectric resonator 110. An output coupling loop 122b inside the cavity shield 120 couples the microwave signal 101 from the dielectric resonator 110 to another end 124b of the coaxial cable.

The input coupling loop 122a and output coupling loop 122b (collectively, coupling loops 122) can be fixed or adjustable. They may be 3-4 mm in diameter, with the closet part of each coupling loop 122 about 8-9 mm from the closest part of the dielectric resonator 110. The coupling loops 122 should be oriented so that the magnetic field from the coupling loop 122 (at the location of the dielectric resonator 110) is in the same direction as the magnetic field in the chosen mode of the dielectric resonator 110. For example, if the magnetic field of the $TE_{01\delta}$ mode of the dielectric resonator 110 is parallel to the dielectric resonator cylinder axis, then the planes of the coupling loops 122 should be normal to the dielectric resonator cylinder axis. This causes the magnetic field from the coupling loops 122 to lie parallel to the dielectric resonator cylinder axis.

In other implementations, they can be replaced with microstrips, striplines, antennas, or inductive couplers.

The sustaining amplifier 130 facilies oscillation in the microwave circuit (oscillator 100) by amplifying the microwave energy which is coupled out of the dielectric resonator 110. The sustaining amplifier 130 may have a low 1/f noise corner (e.g., below 100 kHz, 10 kHz, or even 1 kHz) to reduce phase noise, which can be characterized as a momentary variation in the output frequency of the microwave oscillation signal 101 that is not associated with a change in the physical parameter of interest. Using a dielectric resonator 110 with a high quality factor (e.g., a quality factor of Q=5000 to Q=100,000 in the 1-10 GHz frequency range) can also suppress or reduce the phase noise.

The input of the sustaining amplifier 130 may be connected to an optional bandpass filter 124. The passband of the bandpass filter 124 is centered on the resonant frequency of the dielectric resonator 110 and suppresses transmission modes (e.g., by 10-20 dB) associated with the cavity shield 120 rather than the dielectric resonator 110. The bandpass filter 124 also suppresses higher order or spurious modes (e.g., the $HEM_{11\delta}$ mode) of the dielectric resonator 110. These unwanted modes are usually a few hundred megahertz or more away from the oscillator's resonance frequency. At the same time, the filter passband should be wide enough to accommodate changes in the resonance frequency across the parameter (magnetic field) measurement range and changes caused by thermal drift. In practice, a passband of 50-100 MHz is wide enough to accommodate the expected variation in the resonator frequency of the dielectric resonator 110.

An optional phase shifter 132 coupled to the output of the sustaining amplifier 130 can be used to tune the feedback loop/microwave oscillation signal 101 so that the oscillation frequency coincides with peak transmission through the dielectric resonator 100. The phase shifter 132 can be implemented as a mechanical phase shifter. It can be set manually at the beginning of a measurement, periodically, or as desired. It can also be set in real time based on the measured phase noise of the output 103 using an appropriate feedback mechanism. The phase shifter 132 can also be omitted with careful microwave design of the feedback loop.

The output of the phase shifter 132 is coupled to the input of a three-port directional coupler 140. The directional coupler 140 has one output port coupled to the input coupling loop 122a for the dielectric resonator 110 and another output port coupled to the digitizer 140. The directional coupler 140 couples 50%, 75%, 90%, or more of the microwave oscillation signal 101 to the dielectric resonator 110 and the remaining fraction—e.g., 50%, 25%, 10%, or less of the microwave oscillation signal 101—to the digitizer 142 as an output signal 103. The digitizer 140 converts the (analog) output signal 103 into a digital output signal for analysis with the computer 144, which determines the instantaneous center frequency of the output signal 103. The computer 144 maps the instantaneous center frequency of the output signal 103 to a corresponding change in magnetic field amplitude, electric field amplitude, temperature, strain, or pressure (stress) experienced by the paramagnetic defects in the dielectric resonator 110.

Depending on the oscillation/resonance frequency, the oscillator output signal 103 (e.g., at 11.600 GHz) can be mixed with a local oscillator (e.g., 11.590 GHz) to produce a down-converted intermediate frequency signal (e.g., at 10 MHz) that can be digitized with the digitizer 142. Down-converting the oscillation signal 103 makes it possible to use a digitizer with a greater bit depth and better noise performance, provided that the local oscillator phase noise is similar to or better than the phase noise of the sensor oscillator. This similar to the measurement performed by a phase noise analyzer, which could be used in place of the digitizer 142 and computer 144. In any case, the phase noise of the oscillator 100 should set the noise floor, not the digitization steps.

Aside from the digitizer 142 and the computer 144, the sustaining amplifier 130 may be the only active element in the oscillator 100. In other words, unlike other magnetic field sensors based on solid-state defect centers, the oscillator 100 does not include and is not coupled to a laser, microwave source, or photodetector. Aside from the sustaining amplifier 130, which may use an input voltage to operate, the oscillator 100 may contain only passive components. As a result, the oscillator's size, weight, and power consumption can be extremely low—much lower than ODMR sensors—and the oscillator 100 can be much simpler to make and operate than ODMR sensors. The oscillator 100 can also be much more rugged and as a result be used in much harsher environments than ODMR sensors.

FIG. 1B shows a self-sustaining oscillator 150 with a one-port geometry. This oscillator 150 includes a dielectric resonator 160 formed of a crystal host doped with paramagnetic defects whose resonance frequencies shift with applied magnetic field, electric field, temperature, etc. The dielectric resonator 160 is in the cavity of an RF-shield enclosure 170 and electromagnetically coupled to a coupling loop 172, which in turn is attached to a coaxial cable 174. The coaxial cable 174 attaches to the emitter 186 of a transistor 180, which acts as a negative resistance sustaining amplifier. The transistor's base 182 is coupled to ground via an inductor 188 and its collector is coupled to a digitizer 192 via an impedance-matching circuit 190.

In operation, microwave signals 151 propagate back and forth between the dielectric resonator 160 and the transistor 180, which couples a portion to the digitizer 192 as an output signal 153. The frequency of the microwave signals 151 and of the output signal 153 change as the paramagnetic species are subjected to changes in magnetic field and/or other physical parameters.

Oscillator Operation

Consider operation of the oscillator 100 by starting with the input to the dielectric resonator 110. The high quality factor of the dielectric resonator 110 ensures reflection of microwave oscillation signals 101 unless the frequency of the of microwave oscillation signal 101 is close to the resonant frequency of the dielectric resonator 110. (An isolator or hybrid coupler in the feedback loop may suppress the reflections.) For example, if the dielectric resonator 110 resonates at 11.6 GHz and has a loaded quality factor of Q=55,000, the intrinsic full-width half-maximum (FWHM) linewidth of the resonator is 11.6 GHz/55,000=211 kHz. Therefore, the dielectric resonator should largely reflect microwave oscillation signals 101 which lie outside the band 11,600±0.0106 MHz. Microwave oscillation signals 101 inside the band 11,600±0.0106 MHz should couple into the dielectric resonator 110.

The resonance frequency of the dielectric resonator 110 can be tuned to allow transmission of the microwave oscillation signal 101 at the chosen magnetic field amplitude. The resonant frequency of the dielectric resonator 110 is a function of the relative permittivity of the material and the dimensions of the dielectric resonator. For a cylindrical dielectric resonator, the resonant frequency can be approximated by:

$$f_{GHz} = \frac{34}{\alpha \sqrt{\varepsilon_r}} \left( \frac{a}{L} + 3.45 \right),$$

where α is the radius (in millimeters), L is the length (height, also in millimeters), and E r is the relative permittivity over the range 0.5<α/L<2 and 30<$\varepsilon_r$<50.

Changing the height or radius of a cylindrical dielectric resonator 110 changes the resonant frequency. This can be accomplished by sanding the dielectric resonator, which makes its height shorter, and therefore increases its frequency. In commercially available dielectric resonators, the resonant frequency can be adjusted by adding material or by pushing a plunger into or out of the cavity shield. The resonator's resonant frequency can also be tuned dynamically, e.g., by heating, straining, or stressing the resonator 110.

The microwave oscillation signal 101 is weakly coupled from the dielectric resonator 110 to the output coupling loop 122b. The coupling from both input and output loops makes the loaded linewidth approximately double the unloaded linewidth. The unloaded linewidth is about 2π×211 kHz in angular frequency units, giving a coupling rate in angular frequency units is a 2π×105 kHz for the input coupling and a 2π×105 kHz for the output coupling.

Following the output coupling loop 122b, the microwave oscillation signal 101 may pass through the bandpass filter 124, which suppresses transmission modes associated with the cavity shield 120 rather than the dielectric resonator 110 as well as higher order or spurious modes of the dielectric resonator 110.

Following the bandpass filter, the microwave oscillation signal 101 is sent to a sustaining amplifier 130. The sustaining amplifier 130 amplifies the microwave oscillation signal 101, making up for round-trip losses in the oscillator 100. It can be advantageous to use a low phase noise amplifier for the sustaining amplifier 130, e.g., a sustaining amplifier 130 based on silicon or SiGe transistors with very low phase noise corners.

Following the sustaining amplifier 130, the amplified microwave oscillation signal 101 propagates to the optional phase shifter 132. The phase shifter 132 is tuned so that the oscillation frequency most closely overlaps with the frequency of maximum transmission of the composite dielectric resonator-paramagnetic spin system (see FIG. 3). In practice this requires setting the phase shifter to precision of lambda/30 or better to achieve best performance. The geometry of the microwave circuit ensures that the oscillator 100 oscillates at the point of maximum transmission of the dielectric resonator 110.

Following the phase shifter 132, the microwave oscillation signal 101 passes through the directional coupler 140. The directional coupler 140 can be a −3 dB coupler, −6 dB coupler, −10 dB coupler, or another similarly valued directional coupler. This directional coupler splits 140 the microwave oscillation signal 101 into two parts. The coupled part of the microwave oscillation signal 101 is sent out of the device 100 as an output signal 103 while the mainline part of the microwave oscillation signal propagates 101 to the dielectric resonator 110. The input coupling loop 122a couples the microwave oscillation signal 101 back into the dielectric resonator 110, allowing the oscillation process to sustain itself.

The readout is performed by digitizing the microwave oscillation signal either directly or after the microwave oscillation is mixed down to lower frequency (e.g., baseband) with a local oscillator (not shown). For example, if the microwave oscillation signal 101 has a carrier frequency of 11.600 GHz, it can be mixed with a frequency reference at 11.590 GHz to produce a signal at 10 MHz, which is then digitized by a 100 MS/s digitizer 142. The computer 144 then demodulates the oscillators' output signal, allowing recovery of the magnetic field. Provided the phase noise of the frequency reference (local oscillator) is better than that of the sensor oscillator, amplifiers are inserted in appropriate places, and the digitizer's read noise is not a limiting factor, the demodulation should be limited by the SNR on the sensor oscillator. In practice this allows a magnetic field shift of a few tens of picotesla (pT) to be resolved in 1 second or less. A 1 pT shift in the magnetic field causes the oscillation frequency to shift by about 0.0003 Hz.

Demodulation Process for AC Magnetic Field

Figure 1C:
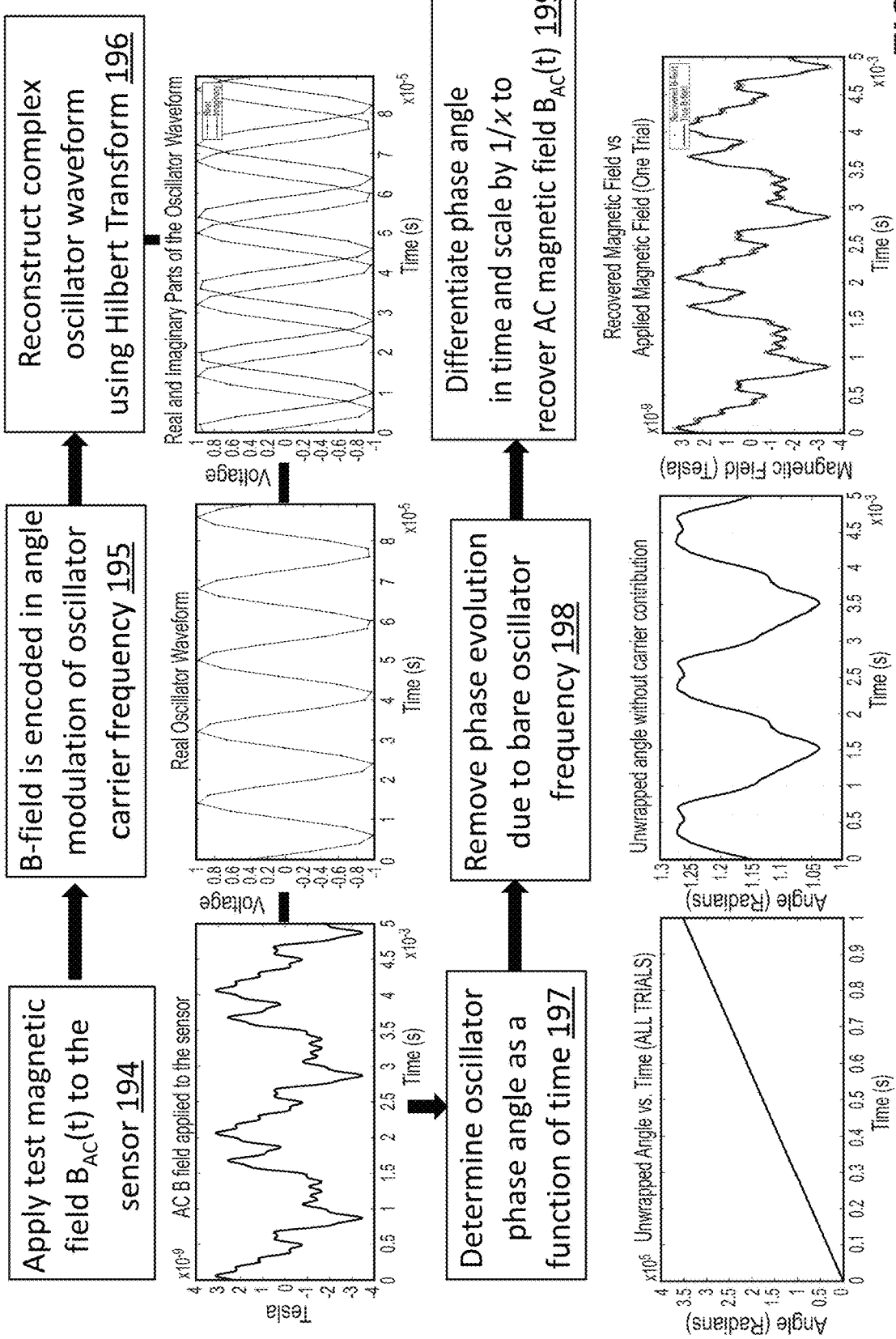
FIG. 1C illustrates a demodulation process for an alternating current (AC) magnetic field applied to a self-sustaining oscillator sensor like the ones in FIGS. 1A and 1B.

FIG. 1C illustrates a process for demodulating the amplitude of an AC magnetic field applied to a self-sustaining oscillator sensor like the ones shown in FIGS. 1A and 1B. (The plots in FIG. 1C are simulations of the quantities that are measured or produced in each step of the process.) The AC magnetic field is applied to the sensor (and in particular to the paramagnetic defects) (194). The value of the magnetic field B (t) applied to the sensor is encoded in angle modulation of the carrier frequency of the self-sustaining oscillator's voltage output waveform (195). This voltage output waveform V(t) is given by $$V(t) = V_0 \cos\left[\int_0^T [\omega_c + \varkappa B(\tau)] d\tau\right].$$

where $V_0$ is the oscillator's voltage amplitude, $\omega_c$ is the angular frequency of the bare dielectric resonator, and $\varkappa$ denotes the proportionality constant by which applied magnetic fields shift the oscillator center frequency.

The oscillator voltage waveform is optionally mixed down to baseband, then digitized and recorded to produce a real-valued voltage waveform with discrete time samples. When the signal has been converted to the digital domain, a processor applies a Hilbert Transform to the recorded oscillator signal (196). This takes the real-valued oscillator signal and converts it to the complex domain, so that complex-valued signal processing techniques can be employed.

From the Hilbert Transform of the oscillator signal, the processor calculates the oscillator phase $\phi(t)$ (197). The oscillator's instantaneous phase $\phi(t)$ can be defined as $$\phi(t) \equiv \int_0^T [\omega_c + \varkappa B(\tau)] d\tau.$$

This includes a contribution from the bare oscillator frequency, which can be removed (198), and scaling by the proportionality constant, $\varkappa$. Differentiating the oscillator's instantaneous phase yields $$\frac{d\phi(t)}{dt} = \omega_c + \varkappa B(t).$$

The time domain magnetic field waveform B (t) is then recovered by calculating (199)

$$B(t) = \frac{\frac{d\phi(t)}{dt} - \omega_c}{\varkappa}.$$

Dielectric Resonators

Figure 2A:
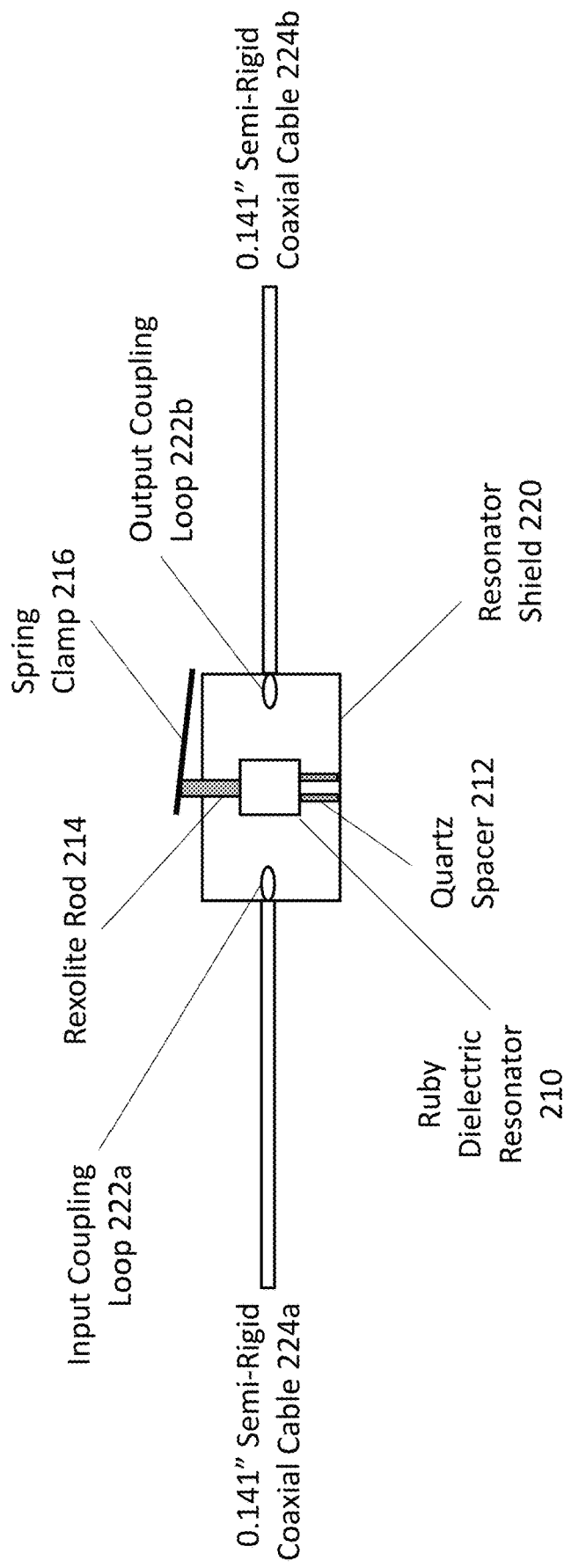
FIG. 2A shows an inventive dielectric resonator for sensing an external field, such as a magnetic field, in an RF-shielded enclosure.

FIG. 2A illustrates an inventive dielectric resonator 210 in greater detail. The dielectric resonator 210 is cut from a synthetically created single crystal of ruby, which is $Al_2O_3$ (sapphire) doped with trivalent chromium as the paramagnetic defect (about 0.05% molar substitution for aluminum in the lattice, which results in a $Cr^{3+}$ density of about $2.5 \times 10^{19}$ $cm^{-3}$). Other suitable paramagnetic defects and host materials for dielectric resonators include but are not limited to $Fe^{3+}$:$Al_2O_3$ (trivalent iron in sapphire), $Fe^{3+}$:$Be_3Al_2Si_6O_{18}$ (trivalent iron in beryl), $Fe^{3+}$:$SiO_2$ (trivalent iron in quartz), $NV^-$:diamond (negatively charged nitrogen vacancy in diamond), $VV^0$:SiC (neutral divacancy in silicon carbide), or other defects in emerald, spinel, aluminum silicate, and yttrium aluminum garnet. Defects formed of single atoms (e.g., $Cr^{3+}$, $Fe^{3+}$, $Gd^{3+}$, and $Ni^{2+}$) tend to be preferable to defects formed of two species ($NV^-$ in diamond, $VV^0$ in silicon carbide). Reasonable defect doping densities are 1-500 ppm.

The dielectric resonator 210 is formed in the shape of a cylinder with a diameter of 6.86 mm and a height of 5.72 mm for a resonant frequency of 11.600 GHz. The dielectric resonator 210 is held in the center of a cavity in a cavity shield 220 by a support structure, which may be a tube 212 made of quartz or another low-loss microwave material, such as alumina. The cavity diameter should be approximately three to five times the diameter of the dielectric resonator 210. The height of the cavity is similar to the diameter of the cavity (e.g., about ⅔ the diameter of the cavity). The optimal dimensions can be determined using finite element analysis.

Suitable resonant modes in a cylindrical dielectric resonator include the $TE_{01\delta}$ and $HEM_{11\delta}$ modes. Generally, unused resonant modes should be suppressed to improve performance. For example, the $HEM_{11\delta}$ mode can be suppressed or eliminated in a cylindrical dielectric resonator by drilling a small hole along the axis of the dielectric resonator. Other suitable resonator shapes include spheres, which resonate in the $HEM_{11\delta}$ or $TE_{01\delta}$ modes, or quarter-wavelength slabs.

The dielectric resonator 210 is secured from above by a 3 mm diameter piece of Rexolite rod 214 which is clamped with a spring clamp 216. An input coupling loop 222a coupled to a first coaxial cable 224a and an output coupling loop 222b coupled to a second coaxial cable 224b extend into the cavity inside the cavity shield 220 and couple microwave radiation into and out of, respectively, the dielectric resonator 210.

The unloaded quality factor of the dielectric resonator 210 should be as high as possible, for example, $Q_0 = 55,000$. Higher unloaded quality factors $Q_0$ result in a dielectric resonator with lower linewidth, and therefore a self-sustaining oscillator with lower phase noise.

Housing the dielectric resonator 210 inside the cavity shield 220 helps to keep the unloaded quality factor high. The cavity shield 220 reduces radiative losses and other losses, thereby preventing the dielectric resonator 210 quality factor from being degraded by these effects. The cavity shield 220 may include a metallic component. The thickness of the metallic component should be greater than or equal to the skin depth at the self-sustaining oscillator's oscillation frequency (at 11.600 GHz, the skin depths of copper is about 600 nm). The metallic component of the cavity shield 220 can be thin enough (e.g., 1-10 microns) so that high-frequency magnetic fields (e.g., up to 100 kHz) can still penetrate the cavity shield 220 and cause frequency modulation of the microwave oscillation signal in the self-sustaining oscillator. Thicker metallic layers may attenuate higher-frequency AC magnetic fields.

Magnetic fields with frequencies corresponding to a skin depth larger than the thickness of the metallic part of the cavity shield 220 should be largely unattenuated. Magnetic fields with frequencies corresponding to a skin depth thinner than the thickness of the metal part of the metallic part of the cavity shield 220, will be attenuated. In this implementation, the cavity shield 220 is a cylinder with inner dimensions of 24 mm in diameter and 16.1 mm in height. The metallic part of the cavity shield 220 can be made of a conductive material, such as copper, silver, aluminum or other high-electrical-conductivity metal.

The dielectric resonator can be replaced with a metallic cavity partially or completely filled with a single crystal containing the paramagnetic defects. The dielectric resonator can also be in the shape of a slab. In another implementation the dielectric resonator is replaced instead with a microstrip resonator, an omega resonator, or a loop gap resonator fabricated either on the single crystal containing the paramagnetic defects or in close proximity to the single crystal containing the paramagnetic defects.

Figure 2B:
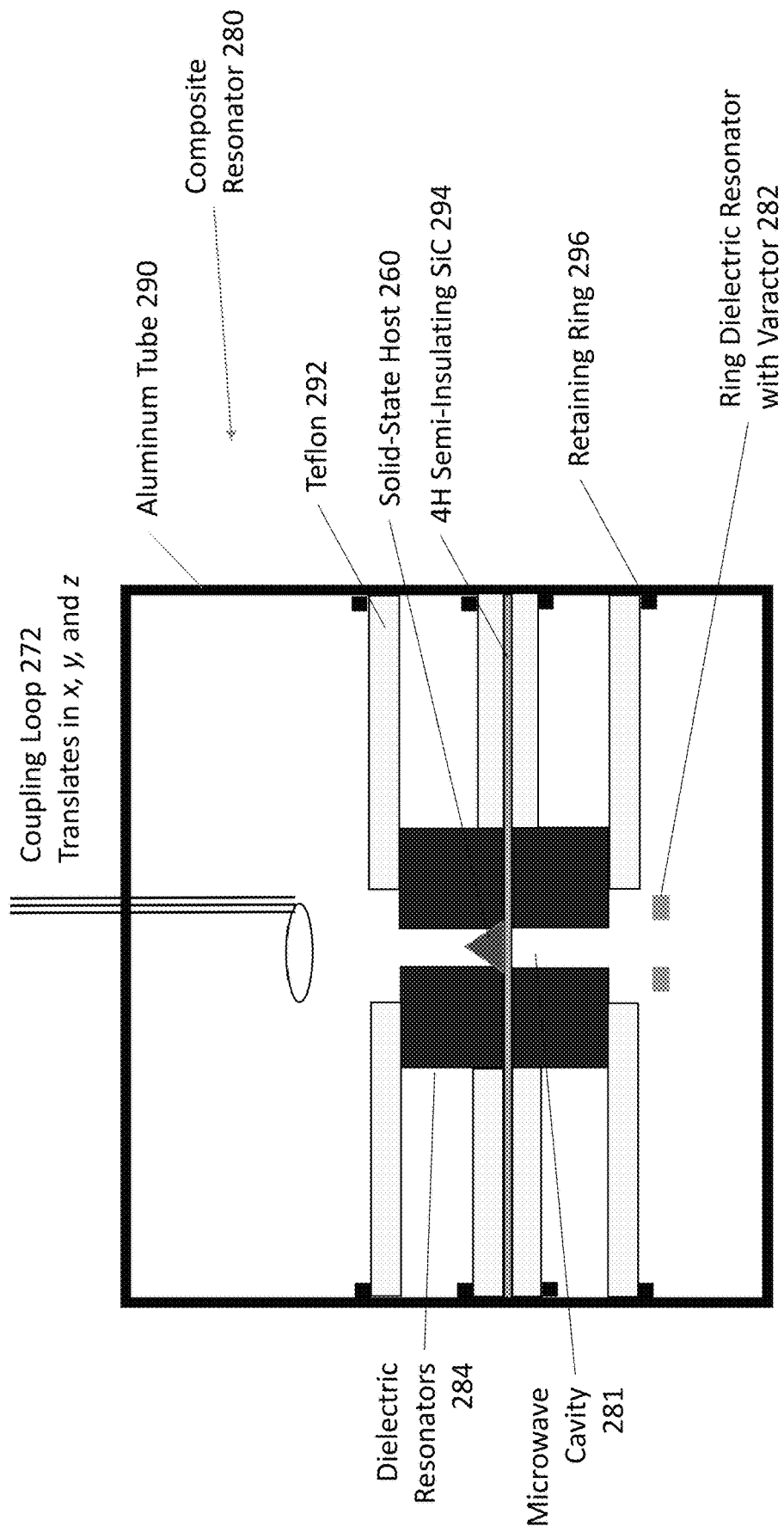
FIG. 2B shows a composite resonator suitable for use in an inventive self-sustaining oscillator.

FIG. 2B shows a longitudinal cross section of a composite microwave resonator 280 that includes both a solid-state host 260 with paramagnetic defects and a separate resonant component 284, such as a dielectric resonator, microstrip transmission line resonator, a loop gap resonator, or a cavity resonator. The separate resonator 284 enhances the interaction between the paramagnetic defects in a solid-state host 260 and the microwave signal oscillating in the self-sustaining oscillator. The solid-state host 260 sits in a microwave cavity 281 formed by dielectric resonators 284, which are sandwiched between Teflon retaining rings 292 and 296 in a housing (aluminum tube 290). (The microwave cavity 281 can also be formed by a metallic loop gap resonator or insulating material plated with an electrically conductive material, such as sapphire plated with silver.) The composite microwave resonator 280 can also be composed of planar elements and can be implemented as a split ring resonator, a quarter-wavelength resonator, a patch antenna, or any other suitable microwave resonator. A semi-insulating silicon carbide substrate 294 supports the solid-state host 280 in the cavity 281 and dissipates heat from the solid-state spin sensor 280.

The input microwave radiation is coupled into the composite microwave resonator 280 by inductive coupling using a wire loop 272 that sticks through a hole in the aluminum lens tube 290 and can be moved in three dimensions. Alternatively, the input microwave radiation can be coupled into the composite microwave resonator 280 by capacitive coupling with a wire loop, end coupling, or any other suitable method of resonator coupling.

If desired, an actuator 282, shown in FIG. 2B as a ring coupled to one or more varactors (not shown), can be used to tune the resonance frequency of the composite microwave cavity 280. Moving the ring dielectric resonator and varactor 282 toward or away from the dielectric resonators 284 shifts both the unloaded quality factor (Q) and resonance frequency of the composite microwave resonator 280. Other suitable actuators include piezo-electric elements, tunable capacitors, and switchable capacitor banks that tune the composite microwave resonator's capacitance.

Physical Mechanism for Sensing Magnetic Field

Without being bound by any particular theory, here is an example of how the solid state spin sensor can be used to measure the value of a physical parameter. For concreteness, this example is on measuring the value of a magnetic field, i.e., the solid-state spin sensor is used as a magnetometer, but similar analyses can be done for measuring electric field, pressure (stress), strain, temperature, or other parameters. The crystal contained in the self-sustaining oscillator contains paramagnetic defects that respond to a magnetic field. This response provides a mechanism to introduce magnetic field sensitivity to the oscillator frequency.

We consider the paramagnetic defect trivalent chromium in sapphire ($Cr^{3+}$:$Al_2O_3$). For a magnetic field $B_0$ applied along the defect symmetry axis (the crystal's c axis), the transition frequencies for this spin-$\frac{3}{2}$ defect are given by $$f_\pm = \frac{2D}{h} \pm \frac{\gamma}{2\pi} B_0,$$

where 2D is the zero-field splitting, h is Planck's constant, and $\gamma$ is the gyromagnetic ratio. Here, $f_+$ corresponds to the $\Delta m_s = +1$ ($m_s = +\frac{1}{2} \to m'_s = +\frac{3}{2}$) transition, and $f_-$ corresponds to the $\Delta m_s = -1$ ($m_s = -\frac{1}{2} \to m'_s = -\frac{3}{2}$) transition. One way to resolve the $\Delta m_s = +1$ and $\Delta m_s = -1$ transitions is by applying only left-hand circularly-polarized or only right-hand circularly-polarized microwaves along the symmetry axis. Another way to accomplish this is to apply a bias magnetic field, which instead resolves the transitions by spectrally separating the resonance frequencies. For the purpose of this explanation, we assume that the polarization of the applied microwaves is selected to address only $\Delta m_s = +1$ transitions.

In the vicinity of the paramagnetic resonance, the complex susceptibility of the paramagnetic defects is $\chi = \chi' - i\chi''$. The complex susceptibility characterizes the response of the paramagnetic spins to magnetic RF or MW fields applied to the spins. The values of $\chi'$ and $\chi''$ are given by $$\chi' = -\frac{1}{2}\chi_0 \frac{\omega_s(\omega_d - \omega_s)T_2^2}{1 + (\omega_d - \omega_s)^2 T_2^2 + \left(\gamma n_\perp \frac{B_1}{2}\right)^2 T_1 T_2}$$

$$\chi'' = \frac{1}{2}\chi_0 \frac{\omega_s T_2}{1 + (\omega_d - \omega_s)^2 T_2^2 + \left(\gamma n_\perp \frac{B_1}{2}\right)^2 T_1 T_2},$$

where $\omega_d$ is the microwave drive frequency in angular frequency units, $\omega_s$ is the spin resonance frequency in angular frequency units, $\chi_0$ is a scaling parameter that characterizes the susceptibility, $T_1$ and $T_2$ are the longitudinal and relevant transverse relaxation times, $B_1$ is amplitude in the lab frame of the RF magnetic field applied to drive transitions in the paramagnetic defect, and $n_\perp$ is an angular correction equal to the sine of the angle between the defect symmetry axis and $B_1$. When applying microwave polarization to drive only the $\Delta m_s = +1$ transitions for a DC magnetic field $B_0$ along the defect symmetry axis, the single resonance frequency is approximately, $f_+ = (2D/h) + (\gamma/2\pi)B_0$, so that $\omega_{s+} = 2\pi(2D/h) + \gamma B_0$.

The dimensions of the dielectric resonator are set so that the dielectric resonator's bare (in the absence of the paramagnetic defects) resonant frequency $\omega_c/(2\pi)$ is near the zero-field splitting 2D/h of the paramagnetic defects, i.e., $f_c = \omega_c/(2\pi) \approx 2D/h$. Under these conditions and when $\chi_0 \ll 1$ and $\gamma^2 H_1^2 T_1 T_2 \ll 1$, it can be shown that the dielectric resonator's modified (due to the action of the paramagnetic defects) resonance frequency $f_c'$ is $$\frac{d}{d(B_0)} f_c(B_0) \approx -\frac{\gamma}{8\pi} \chi_0 \omega^2 T_2^2.$$

Put differently, the dielectric resonator's resonant frequency shifts approximately linearly with the magnetic field applied along the symmetry axis. At zero magnetic field, the modified resonance frequency $f_c'(B_0=0) = f_c$, so for a non-zero magnetic field:

$$f'_c(B_0) = f_c - \frac{\gamma}{8\pi}\chi_0(\omega_c)^2 T_2^2 \times B_0.$$

In other words, the value of the dielectric resonator's resonance frequency depends approximately linearly on the magnetic field $B_0$ applied along the paramagnetic defects' symmetry axis. In this mode, we can measure the magnetic field along the symmetry axis by simply measuring the resonant frequency of the dielectric resonator, provided the zero-field splitting is constant (achieved in practice by holding the temperature of the crystal constant, for example).

In the more general case, a variety of complications can arise depending on the quantum mechanical structure of the defect used, as well as the operational details of the device (e.g., whether an external bias magnetic field is applied and along what axis). The dependence of the resonant frequency on applied field may differ, but the dependence in any particular case can be easily calculated provided the Hamiltonian of the paramagnetic defect is known. In all cases, the near-degeneracy of a resonant mode of the dielectric resonator and a quantum mechanical microwave transition in the defect, along with the coupling between the defect's quantum mechanical states and the properties of the dielectric resonator (e.g., electric, magnetic, or strain fields), allow useful information to be reconstructed by monitoring the output waveform of the oscillator.

Simulated and Measured Magnetic Field Measurements

Figure 3:
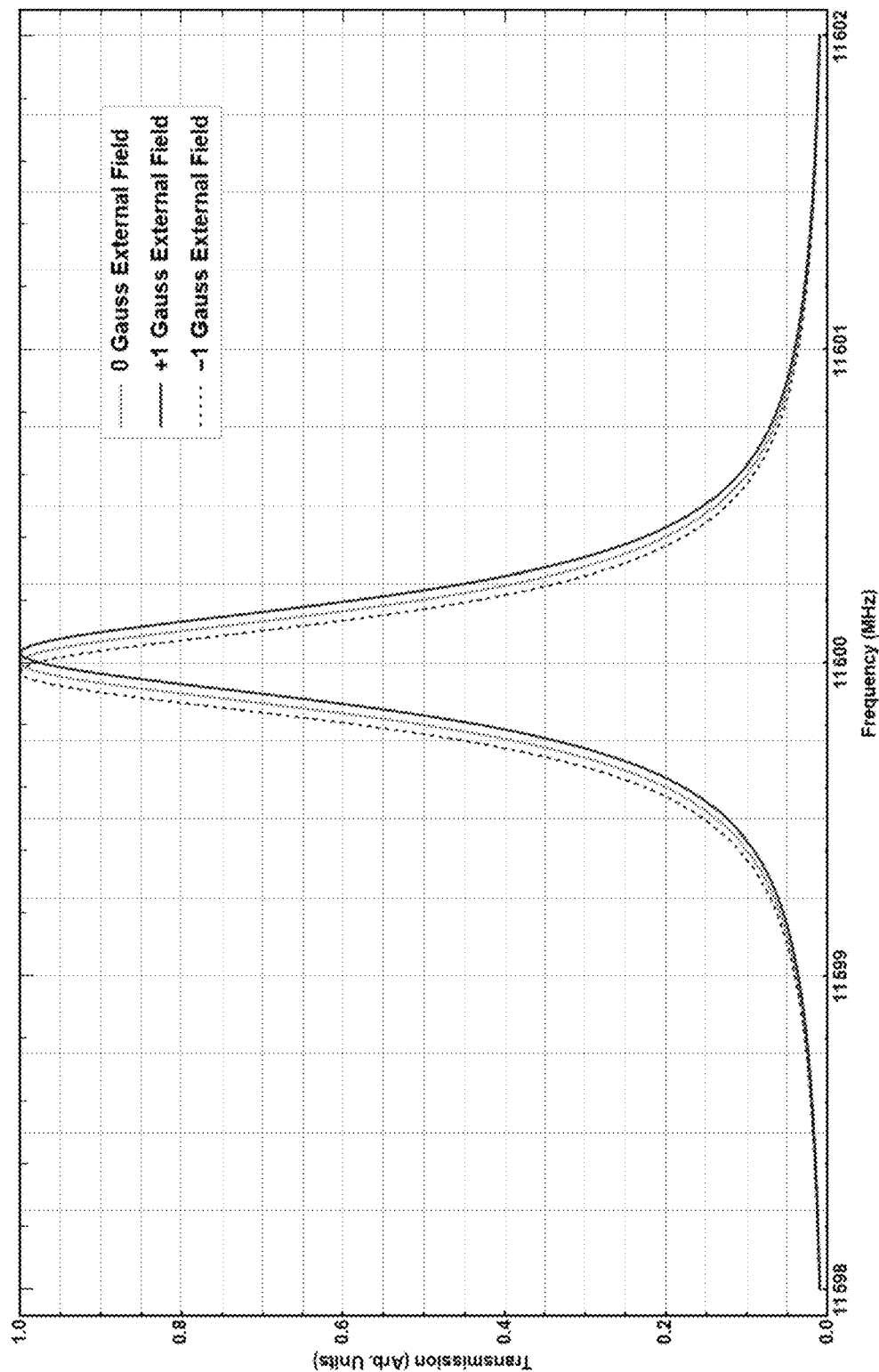
FIG. 3 shows simulated transmission through the dielectric resonator for different values of the magnetic field.
Figure 4:
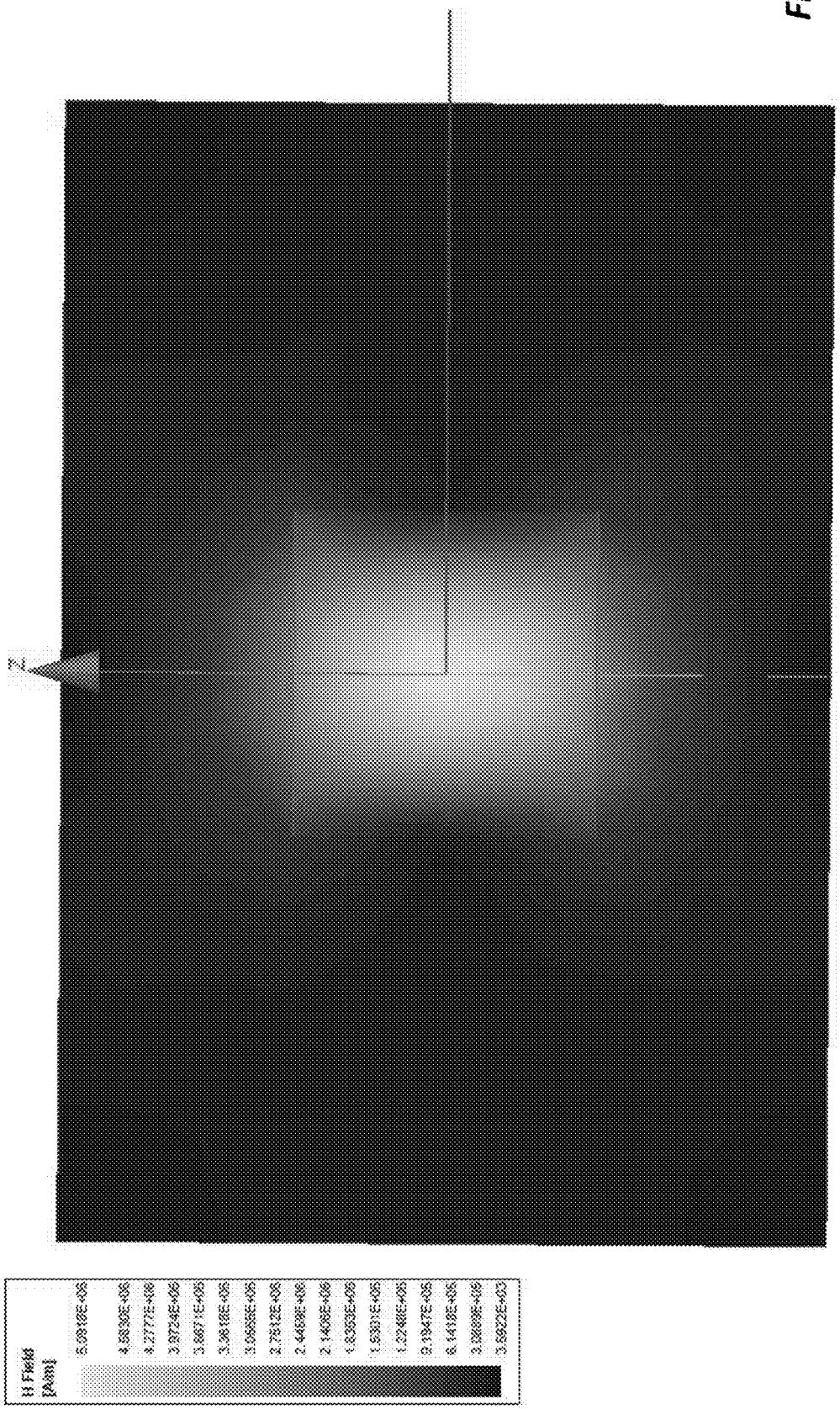
FIG. 4 shows a greyscale map of a simulated H1 field complex amplitude inside the resonator shield.

FIGS. 3 and 4 illustrate simulated data relevant to performance of an oscillator magnetometer with a ruby dielectric resonator with a $Cr^{3+}$ density of about $2.5\times10^{19}$ cm$^{-3}$. The dielectric resonator 500 has a nominal center frequency of 11.6 GHz and a loaded linewidth of about 400 kHz as shown in FIG. 3. Applying a magnetic field to the dielectric resonator along the $Cr^{3+}$ symmetry axis shifts the transmission through the dielectric resonator up or down, depending on the polarity of the magnetic field. A field of +1 Gauss increases the center frequency by about 30 kHz, and a field of −1 Gauss decreases the center frequency by about 30 kHz. This translates to a magnetic field of about 7 Gauss to shift the resonance by an amount equal to the unloaded linewidth (211 kHz). From a sensitivity standpoint, the transmission peak of the dielectric resonator and paramagnetic defects should shift as much as possible for a given magnetic field amplitude.

FIG. 4 shows the simulated magnetic field's complex amplitude inside the cavity shield, with the rectangle in the center representing the dielectric resonator. The magnetic field is primarily contained within the dielectric resonator (containing the paramagnetic spin defects). Higher containment of the magnetic field to the volume containing the paramagnetic defects is desirable to maximize the coupling between the paramagnetic spin system and the dielectric resonator.

Figure 5:
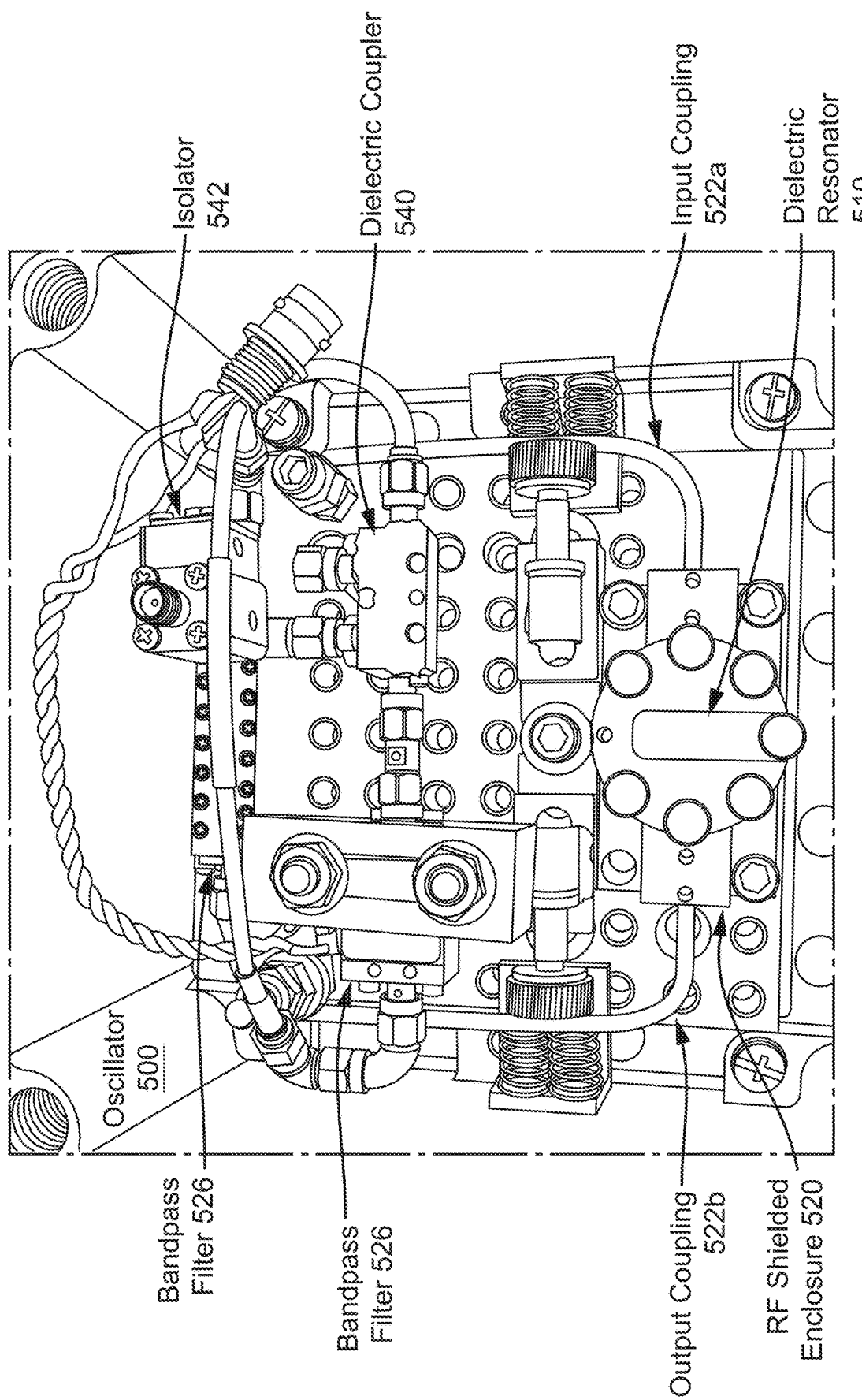
FIG. 5 is a photograph of an example oscillator magnetometer.

FIG. 5 is a photograph of an oscillator magnetometer 500 like the one shown in FIG. 1A. This oscillator magnetometer 500 includes an RF-shielded enclosure 520 containing a dielectric resonator coupled in a feedback loop to a low-noise amplifier 530 with an input coupler 522a and an output coupler 522b. The oscillator magnetometer 500 also includes a bandpass filter 526 and directional coupler 540 connected in series in the feedback loop. An isolator 542 is connected to the coupled port of the directional coupler 540. The bandpass filter 526 attenuates or blocks microwave signals outside the oscillator magnetometer's oscillation band, the directional coupler 540 taps off a portion of the microwave oscillation signal for measurement, and the isolator 542 isolates the oscillation loop from unwanted outside electrical signals.

Figure 6:
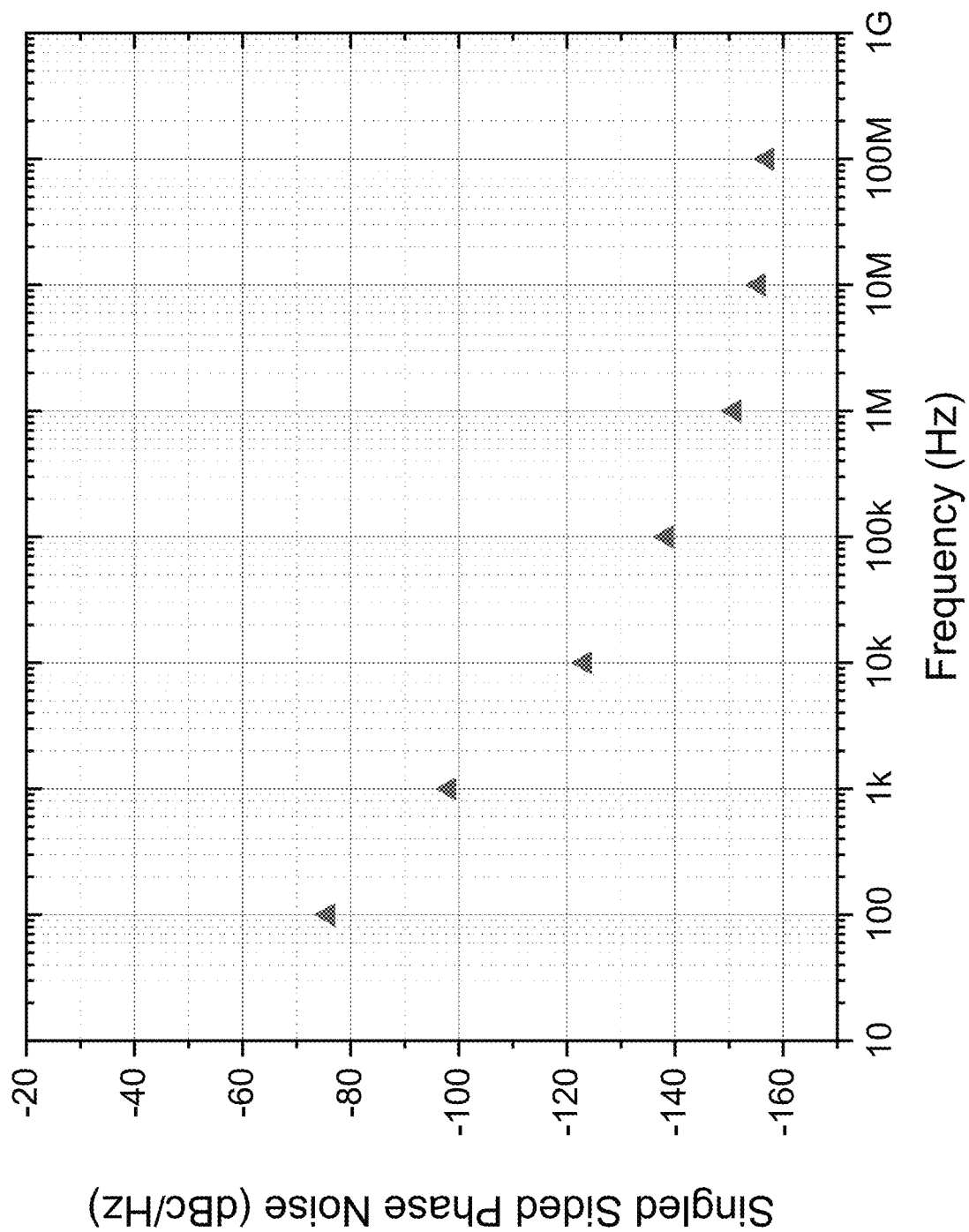
FIG. 6 shows measured phase noise of the oscillator magnetometer of FIG. 5.
Figure 7:
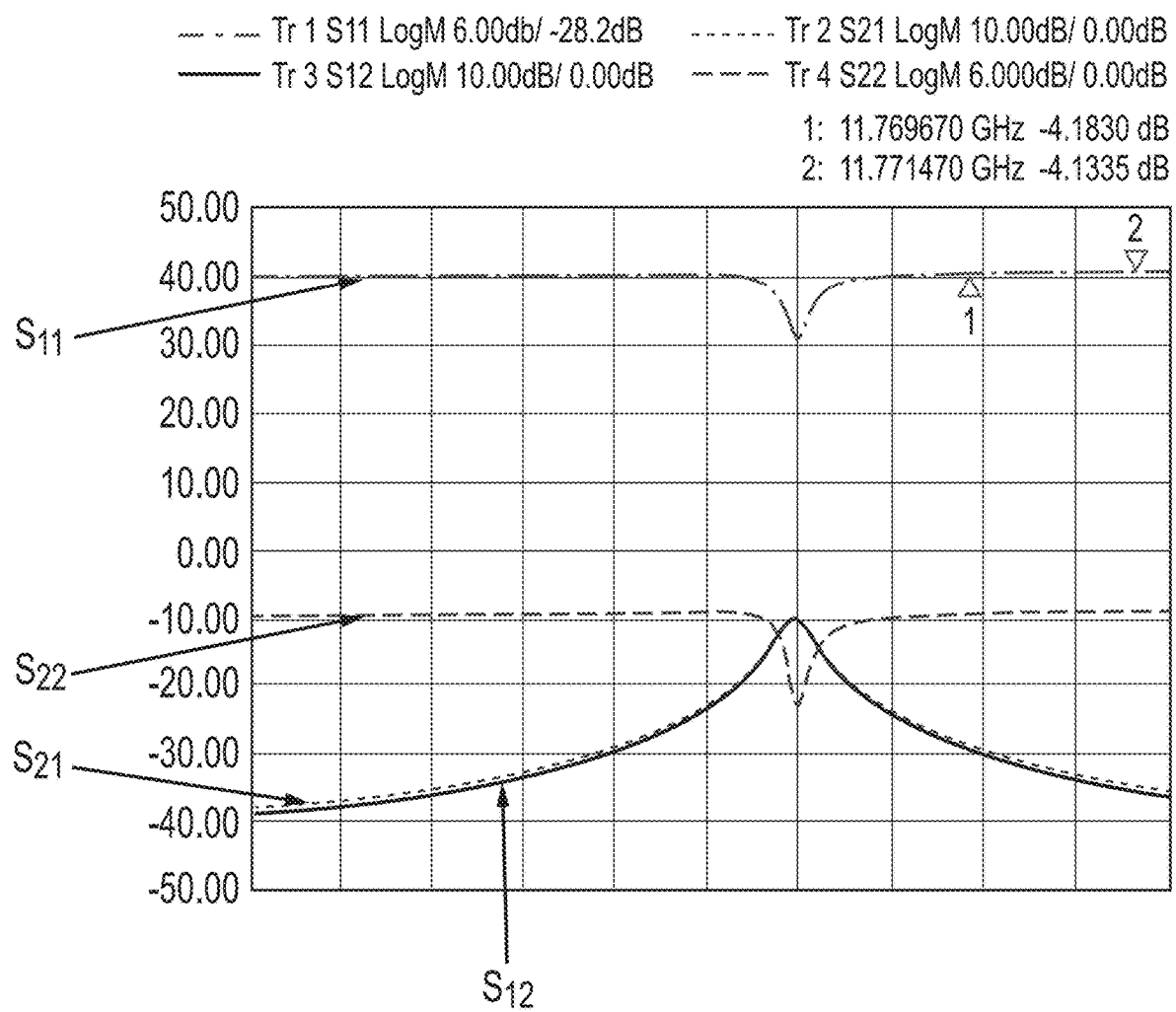
FIG. 7 shows measured values of $S_{11}$, $S_{12}$, $S_{21}$, and $S_{22}$ for the oscillator magnetometer of FIG. 5.
Figure 8:
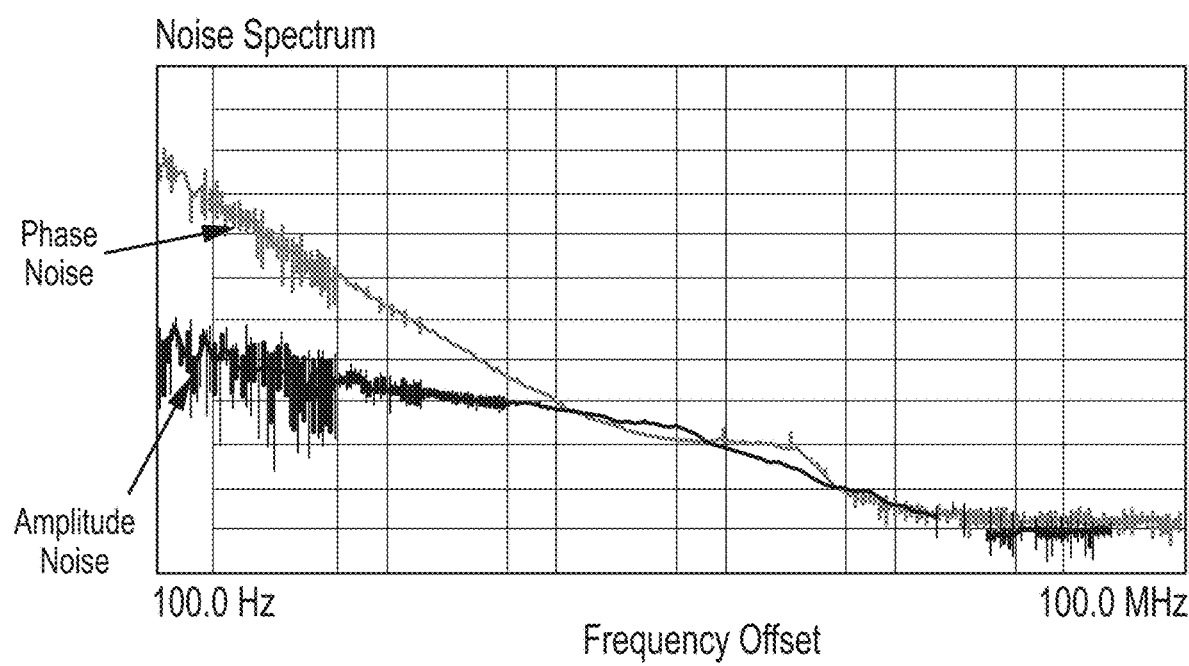
FIG. 8 shows measured phase noise (upper trace) and amplitude noise (lower trace) of the oscillator circuit shown in FIG. 5.

FIGS. 6-8 illustrate measured phase noise performance of the oscillator magnetometer 500 pictured in FIG. 5. FIG. 6 shows the measured phase noise, which falls monotonically from about −75 dB at a frequency of 100 Hz to about −165 dB at a frequency of 100 MHz.

FIG. 7 shows S-parameter measurements of the dielectric resonator 510 component of the oscillator. Port 1 of the Vector Network Analyzer (VNA) is connected to the input coupling port of the dielectric resonator (FIG. 5, 522a) while Port 2 of the Vector Network Analyzer is connected to the output coupling port of the dielectric resonator (FIG. 5, 522b). The S-parameter measurement is performed with the coupling loops in the same position as when the oscillator is operating. This measurement allows the loaded linewidth of the dielectric resonator 510 to be evaluated. The loaded linewidth is an important parameter to predict the oscillator's phase noise. The oscillator's phase noise is the most important parameter determining the sensitivity of the device.

FIG. 8 shows the measured phase noise (upper trace) and amplitude noise (lower trace) for the oscillator 500. The oscillator 500 achieves a phase noise of −123.35 dBc/Hz at an offset frequency of 10 kHz. The bump in the phase noise near 400 kHz is caused by the phase noise of the reference oscillator used to mixed the 11.6 GHz frequency of oscillator 500 down to the range accessible by the phase noise analyzer (10 MHz-8 GHz), and is not due to oscillator 500 itself.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein.

The foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A magnetometer comprising:
a solid-state host comprising paramagnetic defects having spin resonances that shift in response to a magnetic field;
a sustaining amplifier, connected in a positive feedback loop with the solid-state host, to amplify a microwave signal modulated by a shift in the spin resonances of the paramagnetic defects caused by the magnetic field; and
a digitizer, in electrical communication with the sustaining amplifier and/or the solid-state host, to digitize a portion of the microwave signal,
wherein the magnetometer does not include a laser, an external microwave source, or a photodetector.

2. The magnetometer of claim 1, wherein the solid-state host is configured to resonate at a center frequency of the microwave signal in an absence of the magnetic field.

3. The magnetometer of claim 2, wherein the solid-state host forms a dielectric resonator having a quality factor of about 1000 to about 100,000.

4. The magnetometer of claim 2, wherein the solid-state host resonates at a frequency in a frequency band of about 1 GHz to about 25 GHz.

5. The magnetometer of claim 1, wherein the spin resonances of the paramagnetic defects have linewidths of between 1 kHz and 50 MHz.

6. The magnetometer of claim 1, further comprising:
a cavity shield, surrounding the solid-state host, to shield the solid-state host from radiative loss.

7. The magnetometer of claim 6, wherein the cavity shield comprises a metallic component having a thickness greater than or equal to one skin depth at a center frequency of the microwave signal.

8. The magnetometer of claim 1, further comprising:
an input coupler, operably connected to an output of the sustaining amplifier, to couple the microwave signal from the output of the sustaining amplifier to the solid-state host; and
an output coupler, operably connected to an input of the sustaining amplifier, to couple the microwave signal from the solid-state host to the input of the sustaining amplifier.

9. The magnetometer of claim 1, further comprising:
a directional coupler, operably coupled to the digitizer and to at least one of the solid-state host or the sustaining amplifier, to couple the portion of the microwave signal to the digitizer.

10. The magnetometer of claim 1, further comprising:
a phase shifter, in the positive feedback loop, to adjust a path length of the positive feedback loop.

11. The magnetometer of claim 1, further comprising:
a bandpass filter, in electromagnetic communication with an input of the sustaining amplifier, to filter at least one spurious signal from the microwave signal.

12. The magnetometer of claim 1, further comprising:
a bias magnet, in electromagnetic communication with the paramagnetic defects, to apply a bias magnetic field to the paramagnetic defects, the bias magnetic field splitting the spin resonances.

13. A magnetometer comprising:
an oscillator comprising a dielectric resonator connected in a feedback loop with an amplifier and configured to oscillate at a microwave oscillation frequency, the dielectric resonator comprising paramagnetic defects having dielectric resonances that shift the microwave oscillation frequency in response to a magnetic field;
a sensor, operably coupled to the oscillator, to measure the microwave oscillation frequency; and
a processor, operably coupled to the sensor, to determine an amplitude of the magnetic field based on the microwave oscillation frequency,
wherein the magnetometer does not include a laser, an external microwave source, or a photodetector.

14. A sensor to sense a physical parameter, the sensor comprising:
a self-sustaining oscillator with paramagnetic defects in a crystal host, the paramagnetic defects in the crystal host having energy levels that change in response to changes in the physical parameter, and without a laser, an external microwave source, or a photodetector.

15. The sensor of claim 14, wherein the sensor is configured to encode a value of the physical parameter in an output frequency of the self-sustaining oscillator.

16. The sensor of claim 14, wherein the self-sustaining oscillator comprises:
a dielectric resonator, as least part of which is magnetically sensitive, configured to transmit microwave probe radiation with a transmission that varies in response to a change in the physical parameter.

17. The sensor of claim 16, wherein the dielectric resonator is formed entirely of the crystal host.

18. The sensor of claim 16, wherein the dielectric resonator comprises the crystal host containing the paramagnetic defects and a component without paramagnetic defects.

19. The sensor of claim 18, wherein the component without paramagnetic defects comprises one of a microstrip transmission line resonator, a loop gap resonator, or a cavity resonator.

20. The sensor of claim 16, wherein the dielectric resonator has a resonance frequency tuned near a zero field splitting of the paramagnetic defects.

* * * * *